(12) United States Patent
Sato et al.

(10) Patent No.: US 9,034,155 B2
(45) Date of Patent: May 19, 2015

(54) INORGANIC-PARTICLE-DISPERSED SPUTTERING TARGET

(75) Inventors: Atsushi Sato, Ibaraki (JP); Yuichiro Nakamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 910 days.

(21) Appl. No.: 13/147,782

(22) PCT Filed: Jul. 27, 2010

(86) PCT No.: PCT/JP2010/062590
§ 371 (c)(1),
(2), (4) Date: Aug. 3, 2011

(87) PCT Pub. No.: WO2011/016365
PCT Pub. Date: Feb. 10, 2011

(65) Prior Publication Data
US 2011/0284373 A1  Nov. 24, 2011

(30) Foreign Application Priority Data
Aug. 6, 2009 (JP) ................. 2009-183418

(51) Int. Cl.
C23C 14/34 (2006.01)
G11B 5/851 (2006.01)

(52) U.S. Cl.
CPC ............ G11B 5/851 (2013.01); C23C 14/3414 (2013.01)

(58) Field of Classification Search
CPC .. C23C 14/3414; H01J 37/3426; G11B 5/851
USPC ........................................ 204/298.12, 298.13
See application file for complete search history.

(56) References Cited

U.S. PATENT DOCUMENTS

| | | | |
|---|---|---|---|
| 6,406,600 B1 | 6/2002 | Takashima | |
| 6,716,542 B2 | 4/2004 | Uwazumi et al. | |
| 7,909,949 B2 | 3/2011 | Nakamura et al. | |
| 7,927,434 B2 | 4/2011 | Nakamura et al. | |
| 8,568,576 B2 | 10/2013 | Sato | |
| 8,663,402 B2 | 3/2014 | Nakamura et al. | |
| 2003/0228238 A1 | 12/2003 | Zhang et al. | |
| 2004/0018110 A1 | 1/2004 | Zhang | |
| 2004/0208774 A1 | 10/2004 | Zhang | |
| 2006/0233658 A1* | 10/2006 | Ziani | 419/19 |
| 2007/0134124 A1 | 6/2007 | Zhang | |
| 2007/0189916 A1 | 8/2007 | Zhang | |
| 2007/0209547 A1 | 9/2007 | Irumata et al. | |
| 2008/0062575 A1 | 3/2008 | Shimizu | |
| 2009/0242393 A1* | 10/2009 | Satoh | 204/298.13 |
| 2009/0308740 A1 | 12/2009 | Kato et al. | |
| 2010/0089622 A1 | 4/2010 | Irumata et al. | |
| 2010/0320084 A1 | 12/2010 | Sato | |
| 2011/0048935 A1 | 3/2011 | Koide | |
| 2011/0132757 A1 | 6/2011 | Nakamura et al. | |
| 2011/0162971 A1 | 7/2011 | Nakamura et al. | |
| 2011/0247930 A1 | 10/2011 | Sato | |
| 2012/0241317 A1 | 9/2012 | Ikeda et al. | |
| 2012/0273347 A1 | 11/2012 | Koide | |
| 2013/0001079 A1 | 1/2013 | Sato | |
| 2013/0015061 A1 | 1/2013 | Sato | |
| 2013/0112555 A1 | 5/2013 | Ogino et al. | |
| 2013/0134038 A1 | 5/2013 | Sato et al. | |
| 2013/0213802 A1 | 8/2013 | Sato et al. | |
| 2014/0001038 A1 | 1/2014 | Ogino et al. | |

FOREIGN PATENT DOCUMENTS

| | | |
|---|---|---|
| JP | 02-187916 A | 7/1990 |
| JP | 09-025566 A | 1/1997 |
| JP | 10-088333 A | 4/1998 |
| JP | 11-097224 A | 4/1999 |
| JP | 2004-206805 A | 7/2004 |
| JP | 2009-001860 A | 1/2009 |
| JP | 4422203 1 B | 2/2010 |
| WO | WO 2007/080781 * | 7/2007 |
| WO | 2009/119812 A1 | 10/2009 |

* cited by examiner

Primary Examiner — Rodney McDonald
(74) Attorney, Agent, or Firm — Howson & Howson LLP

(57) ABSTRACT

Provided is an inorganic-particle-dispersed sputtering target in which inorganic particles are dispersed in a Co base material, wherein the inorganic particles have an electric resistivity of $1\times10^1$ $\Omega\cdot m$ or less and the volume ratio of the inorganic particles in the target is 50% or less. The sputtering target thus adjusted is advantageous in that, when sputtering is performed using a magnetron sputtering device comprising a DC power source, the inorganic particles are less charged, and arcing occurs less frequently. Accordingly, by using the sputtering target of the present invention, the occurrence of particles attributable to the arcing reduces, and a significant effect of improving the yield in forming a thin film is obtained.

20 Claims, No Drawings

INORGANIC-PARTICLE-DISPERSED SPUTTERING TARGET

BACKGROUND OF THE INVENTION

The present invention relates to an inorganic-particle-dispersed sputtering target for use in the deposition of a magnetic thin film of a magnetic recording medium, and particularly of a granular magnetic recording film of a hard disk adopting the perpendicular magnetic recording system; and to a sputtering target which generates minimal arcing when sputtering is performed with a magnetron sputtering device comprising a DC power source and which yields a low generation of particles caused by such arcing.

BACKGROUND ART

In the field of magnetic recording, technology has been developed for improving the magnetic property by finely dispersing inorganic materials in a magnetic thin film. As one example thereof, with a hard disk recording medium adopting the perpendicular magnetic recording system, a granular film, in which the magnetic interaction between magnetic particles in the magnetic recording film is blocked or weakened by using a nonmagnetic inorganic material, is adopted to improve the various properties as a magnetic recording medium.

Generally speaking, Co or Co-based alloy is used as the magnetic recording medium. Co—Cr—Pt—$SiO_2$ is known as one of the optimal materials for the foregoing granular film, and this is produced by sputtering an inorganic-particle-dispersed sputtering target in which $SiO_2$ particles as the inorganic material are dispersed in the Co—Cr—Pt alloy base material having Co as its main component.

It is widely known that this kind of inorganic-particle-dispersed sputtering target is produced with the powder metallurgy method since the inorganic particles cannot be uniformly dispersed in the alloy base material with the melting method.

For example, proposed is a method to obtain a sputtering target for magnetic recording medium by subjecting the alloy powder having an alloy phase which is produced by rapid solidification and the powder configuring a ceramic phase to mechanical alloying, uniformly dispersing the powder configuring the ceramic phase in the alloy powder, and molding this by way of hot press (Patent Document 1).

Moreover, even if alloy powder produced by the rapid solidification is not used, an inorganic-particle-dispersed sputtering target can be prepared by preparing commercially available raw powders for the respective components configuring the target, weighing these raw powders to the intended composition, mixing with well-known method such as a ball mill, and molding and sintering the mixed powder by way of hot press.

There are various types of sputtering devices, but a magnetron sputtering device comprising a DC power source is broadly used in light of its high productivity for the deposition of the foregoing magnetic recording film.

This sputtering method is to place a target as a negative electrode opposite to a substrate as a positive electrode, and generate an electric field by applying high voltage between the substrate and the target under an inert gas atmosphere.

Here, inert gas is ionized, plasma consisting of electrons and positive ions is formed, the positive ions in this plasma collide with the target (negative electrode) surface to knock out the constituent atoms of the target, and the extruded atoms adhere to the opposing substrate surface to form a film. The sputtering method employs a principle where the material configuring the target is deposited on the substrate as a result of performing the sequential process described above.

[Patent Document 1] Japanese Laid-Open Patent Publication No. H10-88333

SUMMARY OF THE INVENTION

When an inorganic-particle-dispersed sputtering target is sputtered with the foregoing magnetron sputtering device comprising a DC power source, inorganic particles with large electric resistivity such as $SiO_2$ become charged by colliding with the ionized inert gas atomic ions. When electric charge is further concentrated on these inorganic particles, breakdown will occur and arcing will arise. Consequently, the inorganic particles are discharged from the target surface and some of them become adhered to the substrate. It is known that the size of the particles that adhere to the substrate reach several μm, and this causes a considerable deterioration in the production yield during the thin film production process.

In light of the foregoing problems, an object of this invention is to provide an inorganic-particle-dispersed sputtering target in which the inorganic particles are less charged during sputtering and arcing occurs less frequently when performing sputtering with a magnetron sputtering device comprising a DC power source.

In order to achieve the foregoing object, the present inventors discovered as a result of intense study that, by adjusting the electric resistivity, dimension and shape of the inorganic particles, it is possible to obtain an inorganic-particle-dispersed sputtering target with low arcing occurrence when performing sputtering with a magnetron sputtering device comprising a DC power source.

Based on the foregoing discovery, the present invention provides:

1) An inorganic-particle-dispersed sputtering target, the sputtering target in which inorganic particles are dispersed in a metal base material essentially consisting of Co, wherein the inorganic particles have an electric resistivity of $1\times10^1$ Ω·m or less and the volume ratio of the inorganic particles in the target is 50% or less.

The present invention further provides:

2) An inorganic-particle-dispersed sputtering target, the sputtering target in which inorganic particles are dispersed in an alloy base material with a composition containing 5 at % or more and 50 at % or less of Pt and the remainder being Co, wherein the inorganic particles have an electric resistivity of $1\times10^1$ Ω·m or less and the volume ratio of the inorganic particles in the target is 50% or less.

The present invention further provides:

3) An inorganic-particle-dispersed sputtering target, the sputtering target in which inorganic particles are dispersed in an alloy base material with a composition containing 5 at % or more and 40 at % or less of Cr and the remainder being Co, wherein the inorganic particles have an electric resistivity of $1\times10^1$ Ω·m or less and the volume ratio of the inorganic particles in the target is 50% or less.

The present invention further provides:

4) An inorganic-particle-dispersed sputtering target, the sputtering target in which inorganic particles are dispersed in an alloy base material with a composition containing 5 at % or more and 40 at % or less of Cr, 5 at % or more and 30 at % or less of Pt, and the remainder being Co, wherein the inorganic particles have an electric resistivity of $1\times10^1$ Ω·m or less and the volume ratio of the inorganic particles in the target is 50% or less.

The present invention additionally provides:
5) The inorganic-particle-dispersed sputtering target according to any one of 1) to 4) above, wherein the metal base material in which the inorganic particles are dispersed contains, as an additive element, 0.5 at % or more and 10 at % or less of one or more elements selected from B, Ti, V, Mn, Zr, Nb, Ru, Mo, Ta and W.

The present invention additionally provides:
6) The inorganic-particle-dispersed sputtering target according to any one of 1) to 5) above, wherein the inorganic particles are a material of one or more components selected from carbon, oxide, nitride and carbide.

The present invention additionally provides:
7) The inorganic-particle-dispersed sputtering target according to any one of 1) to 6) above, wherein inorganic particles have a dimension and a shape in which a value obtained by dividing the surface area (unit: $\mu m^2$) of inorganic particles dispersed in the sputtering target by the volume (unit: $\mu m^3$) of the inorganic particles is 0.6 or more (unit: $1/\mu m$).

The present invention additionally provides:
8) The inorganic-particle-dispersed sputtering target according to any one of 1) to 6) above, wherein inorganic particles have a dimension and a shape in which, in a structure based on a cross-section observation of the sputtering target, a value obtained by dividing the outer perimeter (unit: $\mu m$) of individual inorganic particle by the area (unit: $\mu m^2$) of the inorganic particle is 0.4 or more (unit: $1/\mu m$) on average.

The sputtering target thus adjusted is advantageous in that, when sputtering is performed with a magnetron sputtering device comprising a DC power source, the inorganic particles are less charged and arcing occurs less frequently. Accordingly, by using the sputtering target of the present invention, the occurrence of particles attributable to the arcing reduces, and a significant effect of improving the yield in forming a thin film is obtained.

DETAILED DESCRIPTION OF THE INVENTION

As the main component constituting the inorganic-particle-dispersed sputtering target of the present invention, used are (1) Co base material, (2) alloy base material with a composition containing 5 at % or more and 50 at % or less of Pt and the remainder being Co, (3) alloy base material with a composition containing 5 at % or more and 40 at % or less of Cr and the remainder being Co, and (4) alloy base material with a composition containing 5 at % or more and 40 at % or less of Cr, 5 at % or more and 30 at % or less of Pt, and the remainder being Co. Inorganic particles are dispersed in the base material of these component compositions to obtain a sputtering target.

These are components which are required as a magnetic recording medium. Although the mixing ratio is slightly different depending on the alloy component, any of these are able to maintain characteristics as an effective magnetic recording medium. Specifically, these components comprise favorable characteristics as a magnetic recording film with a granular structure, and particularly as a recording film of a hard disk drive adopting the perpendicular magnetic recording system.

What is important in the present invention is that, in the inorganic-particle-dispersed sputtering target, the inorganic particles have an electric resistivity of $1 \times 10^1$ $\Omega \cdot m$ or less. If the electric resistivity is higher than $1 \times 10^1$ $\Omega \cdot m$; depending on the dimension and shape of the inorganic particles, the electric current flowing from the plasma to the inorganic particles during the sputtering becomes larger than the electric current flowing from the inorganic particles into the metal base material that contains such inorganic particles. Accordingly, the possibility that the electric charge is accumulated in the inorganic particles and causes a breakdown will increase.

In order to cause the inorganic particles to have an electric resistivity of $1 \times 10^1$ $\Omega \cdot m$ or less, this can be achieved by selecting an inorganic material with an electric resistivity of $1 \times 10^1$ $\Omega \cdot m$ or less to be used as the raw powder of the sputtering target, mixing this with metal powder without changing the properties thereof, and then sintering the mixed powder. Otherwise, even if the electric resistivity of the raw powder is $1 \times 10^1$ $\Omega \cdot m$ or more, it will suffice when the electric resistivity is $1 \times 10^1$ $\Omega \cdot m$ or less in a target after being subject to reaction sintering.

Basically, it will suffice so as long as the inorganic particles have an electric resistivity of $1 \times 10^1$ $\Omega \cdot m$ or less, and it should be easy to understand that there is no particular limitation in the method thereof.

Moreover, in the present invention, the volume ratio of the inorganic particles in the target is set to be 50% or less. As with the foregoing alloy composition, this is a condition that is required for producing a magnetic recording film with a granular structure, and particularly a recording film of a hard disk drive adopting the perpendicular magnetic recording system.

Moreover, in the present invention, the metal base material in which the inorganic particles are dispersed may contain, as an additive element, 0.5 at % or more and 10 at % or less of one or more elements selected from B, Ti, V, Mn, Zr, Nb, Ru, Mo, Ta and W.

These are elements that are added as needed in order to improve the characteristics as a magnetic recording medium.

With the inorganic-particle-dispersed sputtering target of the present invention, oxides, nitrides and carbides are especially effective as an inorganic substance. One or more types of the foregoing inorganic substances may be used. It will suffice so as long as the inorganic particles have an electric resistivity of $1 \times 10^1$ $\Omega \cdot m$ or less, and there is no particular limitation on the selection thereof.

For example, there are oxides such as $Nb_2O_5$, $SnO_2$, $Ti_2O_3$, $Fe_3O_4$ and $WO_2$, nitrides such as TiN, C (graphite), and carbides such as WC, as the types of inorganic particles.

Moreover, with the inorganic-particle-dispersed sputtering target of the present invention, a value obtained by dividing the surface area of inorganic particles by the volume of the inorganic particles is desirably 0.6 or more (unit: $1/\mu m$). This is because, since the electric current from the inorganic particles will flow easier to the metal containing such inorganic particles as the specific surface area of the inorganic particles increases, the inorganic particles will be charged less during the sputtering. Note that, since it is not easy to measure the surface area and volume of the inorganic particles in the sputtering target, it is also possible to use a value obtained by dividing the outer perimeter (unit: $\mu m$) of individual inorganic particle by the area (unit: $\mu m^2$) of the inorganic particle is 0.4 or more (unit: $1/\mu m$) on average in a structure based on the observation of the polished surface of the sputtering target. The latter is easier as the measurement method.

Upon producing the inorganic-particle-dispersed sputtering target of the present invention, as the metal material, main powder of one or more types selected from Co, Cr and Pt or alloy powder of such metals is prepared. Preferably, the grain size of these powders is within the range of 1 to 20 $\mu m$. If the grain size of the powder is 1 to 20 $\mu m$, more uniform mixing is possible, and segregation of the sintered target and grain coarsening can be prevented.

Nevertheless, the foregoing range is merely a preferred range, and it should be understood that the deviation from the foregoing range does not deny the present invention.

Moreover, as the inorganic material, it is preferable to use inorganic powder with a grain size within the range of 0.2 to 5 μm. This is because, by adjusting the grain size of the inorganic material, more uniform mixing is possible, and the existence of coarse inorganic particles in the sintered target can be prevented. If there are coarse inorganic particles, electric charge is concentrated, breakdown will occur and arcing tends to arise.

Nevertheless, similar to the above, the foregoing range is merely a preferred range, and it should be understood that the deviation from the foregoing range does not deny the present invention.

The foregoing raw powders are weighed to achieve the intended composition, and mixed using a well-known method such as by using a ball mill. By molding and sintering the powder obtained as described above using a vacuum hot pressing device and cutting it into an intended shape, the inorganic-particle-dispersed sputtering target of the present invention can be produced.

Molding and sintering are not limited to hot pressing, and the plasma discharge sintering method and hot isostatic pressing method may also be used. Although the holding temperature during sintering will differ considerably depending on the composition of the sputtering target, this is set to a temperature in which the sintered compact is sufficiently densified within a temperature range in which the inorganic material will not decompose.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Examples 1 to 7, Comparative Examples 1 and 2

In Examples 1 to 7 and Comparative Examples 1 and 2, prepared were Co powder with an average grain size of 3 μm, and, as the inorganic material, $Nb_2O_5$ powder with an average grain size of 2 μm, $SnO_2$ powder with an average grain size of 2 μm, $Ti_2O_3$ powder with an average grain size of 5 μm, $Fe_3O_4$ powder with an average grain size of 0.5 μm, $WO_2$ powder with an average grain size of 1 μm, TiN powder with an average grain size of 8 μm, C (graphite) powder with an average grain size of 5 μm, WC powder with an average grain size of 3 μm, $Al_2O_3$ powder with an average grain size of 0.5 μm, and $SiO_2$ powder with an average grain size of 1 μm.

These powders were weighed so that the volume ratio of Co and inorganic particles after being sintered would be 3:1. The combination of Co and inorganic particles is as shown in Table 1.

The powders were placed in a 10-liter ball mill pot together with zirconia balls as the grinding media, and the ball mill rotated for 20 hours to mix the powders.

The mixed powder was filled in a carbon mold, and hot pressed in a vacuum atmosphere under the following conditions; namely, temperature of 800° C., holding time of 2 hours, and welding pressure of 30 MPa, to obtain a sintered compact. This was further cut with a lathe to obtain a target of a shape with a diameter of 165.1 mm and thickness of 6.35 mm, and this target was sputtered with a DC magnetron sputtering device.

The sputtering conditions were sputtering power of 1 kW and Ar gas pressure of 0.5 Pa. After performing 2 kWhr pre-sputtering, sputtering was performed to achieve the intended film thickness of 1000 nm on the aluminum substrate with a 3.5-inch diameter. Subsequently, the number of particles that adhered to the substrate was measured with a particle counter. In addition, the arcing rate upon continuously sputtering for 12.0 hours with sputtering power of 1 kW was defined based on the number of arcing occurrences which was measured with an arcing counter mounted on the sputtering power source.

Moreover, the outer perimeter and area of inorganic particles in a structural image based on the observation of the polished surface of the sintered compact were obtained with image processing software, and a value was calculated by dividing the outer perimeter by the area.

The foregoing results are shown in Table 1.

In Example 1, used was a $Co-Nb_2O_5$ target. The electric resistivity of the inorganic substances contained in the target was $8\times10^0$ Ω·m, outer perimeter/area of the inorganic particles on the polished surface of the sintered target (value obtained by dividing the outer perimeter (unit: μm) of an inorganic particle by the area (unit: $\mu m^2$) of the inorganic particle) was 1.2 (1/μm), arcing rate was 11 (Count/hour), and number of particles on the substrate was 25.

In Example 2, used was a $Co-SnO_2$ target. The electric resistivity of the inorganic substances contained in the target was $4\times10^{-2}$ Ω·m, outer perimeter/area of the inorganic particles on the polished surface of the sintered target was 1.1 (1/μm), arcing rate was 6 (Count/hour), and number of particles on the substrate was 13.

In Example 3, used was a $Co-Ti_2O_3$ target. The electric resistivity of the inorganic substances contained in the target was $8\times10^{-3}$ Ω·m, outer perimeter/area of the inorganic particles on the polished surface of the sintered target was 0.8 (1/μm), arcing rate was 1 (Count/hour), and number of particles on the substrate was 11.

In Example 4, used was a $Co-Fe_3O_4-WO_2$ target. The electric resistivity of the inorganic substances contained in the target was $1\times10^{-3}$ Ω·m with $WO_2$ and $5\times10^{-3}$ Ω·m with $Fe_2O_3$, outer perimeter/area of the inorganic particles on the polished surface of the sintered target was 1.7 (1/μm), arcing rate was 6 (Count/hour), and number of particles on the substrate was 8.

In Example 5, used was a Co—TiN target. The electric resistivity of the inorganic substances contained in the target was $1\times10^{-6}$ Ω·m, outer perimeter/area of the inorganic particles on the polished surface of the sintered target was 0.5 (1/μm), arcing rate was 3 (Count/hour), and number of particles on the substrate was 18.

In Example 6, used was a Co—C target. The electric resistivity of the inorganic substances contained in the target was $4\times10^{-2}$ Ω·m, outer perimeter/area of the inorganic particles on the polished surface of the sintered target was 0.6 (1/μm), arcing rate was 10 (Count/hour), and number of particles on the substrate was 7.

In Example 7, used was a Co-WC target. The electric resistivity of the inorganic substances contained in the target was $5\times10^{-5}$ Ω·m, outer perimeter/area of the inorganic particles on the polished surface of the sintered target was 1.1 (1/μm), arcing rate was 1 (Count/hour), and number of particles on the substrate was 4.

In Comparative Example 1, used was a $Co-Al_2O_3$ target. The electric resistivity of the inorganic substances contained in the target was $1\times10^{14}$ Ω·m, outer perimeter/area of the inorganic particles on the polished surface of the sintered target was 1.8 (1/μm), arcing rate was 65 (Count/hour), and number of particles on the substrate was 81. Comparative Example 1 did not satisfy the condition of the present invention; namely, "electric resistivity of inorganic particles is $1\times10^{1}$ Ω·m or less".

In Comparative Example 2, used was a Co—$SiO_2$ target. The electric resistivity of the inorganic substances contained in the target was $1\times10^{12}$ Ω·m, outer perimeter/area of the inorganic particles on the polished surface of the sintered target was 1.6 (1/μm), arcing rate was 38 (Count/hour), and number of particles on the substrate was 41. Comparative Example 2 did not satisfy the condition of the present invention; namely, "electric resistivity of inorganic particles is $1\times10^{1}$ Ω·m or less".

As described above, with Examples 1 to 7, it was confirmed that both the arcing rate and number of particles had decreased in comparison to Comparative Examples 1 and 2 which deviate from the conditions of the present invention.

The sputtering conditions were sputtering power of 1 kW and Ar gas pressure of 0.5 Pa. After performing 2 kWhr pre-sputtering, sputtering was performed to achieve the intended film thickness of 1000 nm on the aluminum substrate with a 3.5-inch diameter. Subsequently, the number of particles that adhered to the substrate was measured with a particle counter. In addition, the arcing rate upon continuously sputtering for 12.0 hours with sputtering power of 1 kW was defined based on the number of arcing occurrences which was measured with an arcing counter mounted on the sputtering power source.

Moreover, the outer perimeter and area of inorganic particles in a structural image based on the observation of the polished surface of the sintered compact were obtained with image processing software, and a value was calculated by dividing the outer perimeter by the area.

The foregoing results are shown in Table 2.

In Example 8, used was a Co—Pt—$Nb_2O_5$ target. The electric resistivity of the inorganic substances contained in the target was $8\times10^{0}$ Ω·m, outer perimeter/area of the inor-

TABLE 1

|  | Type of target | Electric resistivity of inorganic substance (Ω · m) | Outer perimeter/area on polished surface (1/μm) | Arcing rate (Count/hour) | Number of particles on substrate (Particle) |
| --- | --- | --- | --- | --- | --- |
| Example 1 | Co—$Nb_2O_6$ | $8\times10^{0}$ | 1.2 | 11 | 25 |
| Example 2 | Co—$SnO_2$ | $4\times10^{-2}$ | 1.1 | 6 | 13 |
| Example 3 | Co—$Ti_2O_3$ | $8\times10^{-3}$ | 0.8 | 1 | 11 |
| Example 4 | Co—$Fe_3O_4$—$WO_2$ | $WO_2\ 1\times10^{-3}$ $Fe_3O_4\ 5\times10^{-3}$ | 1.7 | 6 | 8 |
| Example 5 | Co—TiN | $1\times10^{-6}$ | 0.5 | 3 | 18 |
| Example 6 | Co—C | $4\times10^{-2}$ | 0.6 | 10 | 7 |
| Example 7 | Co—WC | $5\times10^{-5}$ | 1.1 | 1 | 4 |
| Comparative Example 1 | Co—$Al_2O_3$ | $1\times10^{14}$ | 1.8 | 65 | 81 |
| Comparative Example 2 | Co—$SiO_2$ | $1\times10^{12}$ | 16 | 38 | 41 |

Examples 8 to 13, Comparative Examples 3 and 4

In Examples 8 to 13 and Comparative Examples 3 and 4, prepared were, as the metal material, Co powder with an average grain size of 3 μm and Pt powder with an average grain size of 2 μm, and, as the inorganic material, $Nb_2O_5$ powder with an average grain size of 2 μm, $SnO_2$ powder with an average grain size of 2 μm, $Ti_2O_3$ powder with an average grain size of 5 μm, TiN powder with an average grain size of 8 μm, C (graphite) powder with an average grain size of 5 μm, WC powder with an average grain size of 3 μm, $Al_2O_3$ powder with an average grain size of 0.5 μm, and $SiO_2$ powder with an average grain size of 1 μm.

These powders were weighed so that the volume ratio of the alloy and inorganic substances after being sintered would be 4:1, and so that the composition of the alloyed portion would be Co-16 mol % Pt. The combination of alloy and inorganic substances is as shown in Table 2. The powders were placed in a 10-liter ball mill pot together with zirconia balls as the grinding media, and the ball mill rotated for 20 hours to mix the powders.

The mixed powder was filled in a carbon mold, and hot pressed in a vacuum atmosphere under the following conditions; namely, temperature of 1100° C., holding time of 2 hours, and welding pressure of 30 MPa, to obtain a sintered compact. This was further cut with a lathe to obtain a target of a shape with a diameter of 165.1 mm and thickness of 6.35 mm, and this target was sputtered with a DC magnetron sputtering device.

ganic particles on the polished surface of the sintered target was 1.3 (1/μm), arcing rate was 17 (Count/hour), and number of particles on the substrate was 7.

In Example 9, used was a Co—Pt—$SnO_2$ target. The electric resistivity of the inorganic substances contained in the target was $4\times10^{-2}$ Ω·m, outer perimeter/area of the inorganic particles on the polished surface of the sintered target was 1.1 (1/μm), arcing rate was 13 (Count/hour), and number of particles on the substrate was 14.

In Example 10, used was a Co—Pt—$Ti_2O_3$ target. The electric resistivity of the inorganic substances contained in the target was $8\times10^{-3}$ Ω·m, outer perimeter/area of the inorganic particles on the polished surface of the sintered target was 0.7 (1/μm), arcing rate was 5 (Count/hour), and number of particles on the substrate was 11.

In Example 11, used was a Co—Pt—TiN target. The electric resistivity of the inorganic substances contained in the target was $1\times10^{-6}$ Ω·m, outer perimeter/area of the inorganic particles on the polished surface of the sintered target was 0.5 (1/μm), arcing rate was 2 (Count/hour), and number of particles on the substrate was 5.

In Example 12, used was a Co—Pt—C target. The electric resistivity of the inorganic substances contained in the target was $4\times10^{-2}$ Ω·m, outer perimeter/area of the inorganic particles on the polished surface of the sintered target was 0.7 (1/μm), arcing rate was 19 (Count/hour), and number of particles on the substrate was 18.

In Example 13, used was a Co—Pt—WC target. The electric resistivity of the inorganic substances contained in the target was $5\times10^{-5}$ Ω·m, outer perimeter/area of the inorganic particles on the polished surface of the sintered target was 1.2 (1/μm), arcing rate was 6 (Count/hour), and number of particles on the substrate was 13.

In Comparative Example 3, used was a Co—Pt—Al$_2$O$_3$ target. The electric resistivity of the inorganic substances contained in the target was $1\times10^{14}$ Ω·m, outer perimeter/area of the inorganic particles on the polished surface of the sintered target was 1.5 (1/μm), arcing rate was 90 (Count/hour), and number of particles on the substrate was 58. Comparative Example 3 did not satisfy the condition of the present invention; namely, "electric resistivity of inorganic particles is $1\times10^1$ Ω·m or less".

In Comparative Example 4, used was a Co—Pt—SiO$_2$ target. The electric resistivity of the inorganic substances contained in the target was $1\times10^{12}$ Ω·m outer perimeter/area of the inorganic particles on the polished surface of the sintered target was 1.3 (1/μm), arcing rate was 63 (Count/hour), and number of particles on the substrate was 28. Comparative Example 4 did not satisfy the condition of the present invention; namely, "electric resistivity of inorganic particles is $1\times10^1$ Ω·m or less".

As described above, with Examples 8 to 13, it was confirmed that both the arcing rate and number of particles had decreased in comparison to Comparative Examples 3 and 4 which deviate from the conditions of the present invention.

TABLE 2

|  | Type of target | Electric resistivity of inorganic substance (Ω · m) | Outer perimeter/area on polished surface (1/μm) | Arcing rate (Count/hour) | Number of particles on substrate (Particle) |
| --- | --- | --- | --- | --- | --- |
| Example 8 | Co—Pt—Nb$_2$O$_5$ | $8 \times 10^0$ | 1.3 | 17 | 7 |
| Example 9 | Co—Pt—SnO$_2$ | $4 \times 10^{-2}$ | 1.1 | 13 | 14 |
| Example 10 | Co—Pt—Ti$_2$O$_3$ | $8 \times 10^{-3}$ | 0.7 | 5 | 11 |
| Example 11 | Co—Pt—TiN | $1 \times 10^{-6}$ | 0.5 | 2 | 5 |
| Example 12 | Co—Pt—C | $4 \times 10^{-2}$ | 0.7 | 19 | 18 |
| Example 13 | Co—Pt—WC | $5 \times 10^{-5}$ | 1.2 | 6 | 13 |
| Comparative Example 3 | Co—Pt—Al$_2$O$_3$ | $1 \times 10^{14}$ | 1.5 | 90 | 58 |
| Comparative Example 4 | Co—Pt—SiO$_2$ | $1 \times 10^{12}$ | 1.3 | 63 | 28 |

Examples 14 to 17, Comparative Examples 5 and 6

In Examples 14 to 17 and Comparative Examples 5 and 6, prepared were, as the metal material, Co powder with an average grain size of 3 μm and Cr powder with an average grain size of 5 μm, and, as the inorganic material, Nb$_2$O$_5$ powder with an average grain size of 2 μm, Ti$_2$O$_3$ powder with an average grain size of 5 μm, TiN powder with an average grain size of 8 μm, WC powder with an average grain size of 3 μm, Al$_2$O$_3$ powder with an average grain size of 0.5 μm, and SiO$_2$ powder with an average grain size of 1 μm.

These powders were weighed so that the volume ratio of the alloy and inorganic substances after being sintered would be 7:3, and so that the composition of the alloyed portion would be Co-16 mol % Cr. The combination of alloy and inorganic substances is as shown in Table 3.

The powders were placed in a 10-liter ball mill pot together with zirconia balls as the grinding media, and the ball mill rotated for 20 hours to mix the powders.

The mixed powder was filled in a carbon mold, and hot pressed in a vacuum atmosphere under the following conditions; namely, temperature of 1000° C., holding time of 2 hours, and welding pressure of 30 MPa, to obtain a sintered compact. This was further cut with a lathe to obtain a target of a shape with a diameter of 165.1 mm and thickness of 6.35 mm, and this target was sputtered with a DC magnetron sputtering device.

The sputtering conditions were sputtering power of 1 kW and Ar gas pressure of 0.5 Pa. After performing 2 kWhr pre-sputtering, sputtering was performed to achieve the intended film thickness of 1000 nm on the aluminum substrate with a 3.5-inch diameter. Subsequently, the number of particles that adhered to the substrate was measured with a particle counter. In addition, the arcing rate upon continuously sputtering for 12.0 hours with sputtering power of 1 kW was defined based on the number of arcing occurrences which was measured with an arcing counter mounted on the sputtering power source.

Moreover, the outer perimeter and area of inorganic particles in a structural image based on the observation of the polished cross-sectional surface of the sintered compact were obtained with image processing software, and a value was calculated by dividing the outer perimeter by the area.

The foregoing results are shown in Table 3.

In Example 14, used was a Co—Cr—Nb$_2$O$_5$ target. The electric resistivity of the inorganic substances contained in the target was $8\times10^0$ Ω·m, outer perimeter/area of the inorganic particles on the polished surface of the sintered target was 1.3 (1/μm), arcing rate was 9 (Count/hour), and number of particles on the substrate was 12. In Example 15, used was a Co—Cr—Ti$_2$O$_3$ target. The electric resistivity of the inorganic substances contained in the target was $8\times10^{-3}$ Ω·m, outer perimeter/area of the inorganic particles on the polished surface of the sintered target was 0.9 (1/μm), arcing rate was 1 (Count/hour), and number of particles on the substrate was 0. In Example 16, used was a Co—Cr—TiN target. The electric resistivity of the inorganic substances contained in the target was $1\times10^{-6}$ Ω·m, outer perimeter/area of the inorganic particles on the polished surface of the sintered target was 0.7 (1/μm), arcing rate was 3 (Count/hour), and number of particles on the substrate was 8. In Example 17, used was a Co—Cr—WC target. The electric resistivity of the inorganic substances contained in the target was $5\times10^{-5}$ Ω·m, outer perimeter/area of the inorganic particles on the polished surface of the sintered target was 1.2 (1/μm), arcing rate was 2 (Count/hour), and number of particles on the substrate was 3.

In Comparative Example 5, used was a Co—Cr—Al$_2$O$_3$ target. The electric resistivity of the inorganic substances contained in the target was $1\times10^{14}$ Ω·m, outer perimeter/area of the inorganic particles on the polished surface of the sintered target was 1.2 (1/µm), arcing rate was 39 (Count/hour), and number of particles on the substrate was 27. Comparative Example 5 did not satisfy the condition of the present invention; namely, "electric resistivity of inorganic particles is $1 \times 10^1$ Ω·m or less".

In Comparative Example 6, used was a Co—Cr—SiO$_2$ target. The electric resistivity of the inorganic substances contained in the target was $1 \times 10^{12}$ Ω·m, outer perimeter/area of the inorganic particles on the polished surface of the sintered target was 1.3 (1/µm), arcing rate was 30 (Count/hour), and number of particles on the substrate was 18. Comparative Example 6 did not satisfy the condition of the present invention; namely, "electric resistivity of inorganic particles is $1 \times 10^1$ Ω·m or less".

As described above, with Examples 14 to 17, it was confirmed that both the arcing rate and number of particles had decreased in comparison to Comparative Examples 5 and 6 which deviate from the conditions of the present invention.

The sputtering conditions were sputtering power of 1 kW and Ar gas pressure of 0.5 Pa. After performing 2 kWhr pre-sputtering, sputtering was performed to achieve the intended film thickness of 1000 nm on the aluminum substrate with a 3.5-inch diameter. Subsequently, the number of particles that adhered to the substrate was measured with a particle counter. In addition, the arcing rate upon continuously sputtering for 12.0 hours with sputtering power of 1 kW was defined based on the number of arcing occurrences which was measured with an arcing counter mounted on the sputtering power source.

Moreover, the outer perimeter and area of inorganic particles in a structural image based on the observation of the polished surface of the sintered compact were obtained with image processing software, and a value was calculated by dividing the outer perimeter by the area.

The foregoing results are shown in Table 4.

In Example 18, used was a Co—Cr—Pt—Nb$_2$O$_5$ target. The electric resistivity of the inorganic substances contained

TABLE 3

| | Type of target | Electric resistivity of inorganic substance (Ω·m) | Outer perimeter/area on polished surface (1/µm) | Arcing rate (Count/hour) | Number of particles on substrate (Particle) |
|---|---|---|---|---|---|
| Example 14 | Co—Cr—Nb$_2$O$_5$ | $8 \times 10^0$ | 1.3 | 9 | 12 |
| Example 15 | Co—Cr—Ti$_2$O$_3$ | $8 \times 10^{-3}$ | 0.9 | 1 | 0 |
| Example 16 | Co—Cr—TiN | $1 \times 10^{-6}$ | 0.7 | 3 | 8 |
| Example 17 | Co—Cr—WC | $5 \times 10^{-5}$ | 1.2 | 2 | 3 |
| Comparative Example 5 | Co—Cr—Al$_2$O$_3$ | $1 \times 10^{14}$ | 1.2 | 39 | 27 |
| Comparative Example 6 | Co—Cr—SiO$_2$ | $1 \times 10^{12}$ | 1.3 | 30 | 18 |

Examples 18 to 21, 23 and 24, Comparative Examples 7, 8 and 10

In Examples 18 to 21, 23 and 24 and Comparative Examples 7, 8 and 10, prepared were, as the metal material, Co powder with an average grain size of 3 µm, Cr powder with an average grain size of 5 µm and Pt powder with an average grain size of 2 µm, and, as the inorganic material, Nb$_2$O$_5$ powder with an average grain size of 2 µm, Ti$_2$O$_3$ powder with an average grain size of 5 µm, TiN powder with an average grain size of 8 µm, WC powder with average grain size of 3 µm, Nb$_2$O$_5$ powder with an average grain size of 4 µm, CrO$_2$ powder with an average grain size of 2 µm, Al$_2$O$_3$ powder with an average grain size of 1 µm, SiO$_2$ powder with an average grain size of 1 µm, and Nb$_2$O$_5$ powder with an average grain size of 8 µm.

These powders were weighed so that the volume ratio of the alloy and inorganic substances after being sintered would be 7:3, and so that the composition of the alloyed portion would be Co-16 mol % Cr-16 mol % Pt. The combination of alloy and inorganic substances is as shown in Table 4.

The powders were placed in a 10-liter ball mill pot together with zirconia balls as the grinding media, and the ball mill rotated for 20 hours to mix the powders.

The mixed powder was filled in a carbon mold, and hot pressed in a vacuum atmosphere under the following conditions; namely, temperature of 1100° C., holding time of 2 hours, and welding pressure of 30 MPa, to obtain a sintered compact. This was further cut with a lathe to obtain a target of a shape with a diameter of 165.1 mm and thickness of 6.35 mm, and this target was sputtered with a DC magnetron sputtering device.

in the target was $8 \times 10^0$ Ω·m, outer perimeter/area of the inorganic particles on the polished surface of the sintered target was 1.3 (1/µm), arcing rate was 11 (Count/hour), and number of particles on the substrate was 27.

In Example 19, used was a Co—Cr—Pt—Ti$_2$O$_3$ target. The electric resistivity of the inorganic substances contained in the target was $8 \times 10^{-3}$ Ω·m, outer perimeter/area of the inorganic particles on the polished surface of the sintered target was 0.6 (1/µm), arcing rate was 7 (Count/hour), and number of particles on the substrate was 15.

In Example 20, used was a Co—Cr—Pt—TiN target. The electric resistivity of the inorganic substances contained in the target was $1 \times 10^{-6}$ Ω·m, outer perimeter/area of the inorganic particles on the polished surface of the sintered target was 0.6 (1/µm), arcing rate was 6 (Count/hour), and number of particles on the substrate was 11.

In Example 21, used was a Co—Cr—Pt—WC target. The electric resistivity of the inorganic substances contained in the target was $5 \times 10^{-5}$ Ω·m, outer perimeter/area of the inorganic particles on the polished surface of the sintered target was 1.3 (1/µm), arcing rate was 4 (Count/hour), and number of particles on the substrate was 9.

In Example 23, used was a Co—Cr—Pt—Nb$_2$O$_5$ target. The electric resistivity of the inorganic substances contained in the target was $8 \times 10^0$ Ω·m, outer perimeter/area of the inorganic particles on the polished surface of the sintered target was 0.5 (1/µm), arcing rate was 16 (Count/hour), and number of particles on the substrate was 29.

In Example 24, used was a Co—Cr—Pt—CrO$_2$ target. The electric resistivity of the inorganic substances contained in the target was $5 \times 10^{-5}$ Ω·m, outer perimeter/area of the inorganic particles on the polished surface of the sintered target was 0.9 (1/μm), arcing rate was 7 (Count/hour), and number of particles on the substrate was 26.

In Comparative Example 7, used was a Co—Cr—Pt—Al$_2$O$_3$ target. The electric resistivity of the inorganic substances contained in the target was $1\times10^{14}$ Ω·m, outer perimeter/area of the inorganic particles on the polished surface of the sintered target was 1.2 (1/μm), arcing rate was 58 (Count/hour), and number of particles on the substrate was 67. Comparative Example 7 did not satisfy the condition of the present invention; namely, "electric resistivity of inorganic particles is $1\times10^1$ Ω·m or less".

In Comparative Example 8, used was a Co—Cr—Pt—SiO$_2$ target. The electric resistivity of the inorganic substances contained in the target was $1\times10^{12}$ Ω·m, outer perimeter/area of the inorganic particles on the polished surface of the sintered target was 1.0 (1/μm), arcing rate was 31 (Count/hour), and number of particles on the substrate was 29. Comparative Example 8 did not satisfy the condition of the present invention; namely, "electric resistivity of inorganic particles is $1\times10^1$ Ω·m or less".

In Comparative Example 10, used was a Co—Cr—Pt—Nb$_2$O$_5$ target. The electric resistivity of the inorganic substances contained in the target was $8\times10^0$ Ω·m, outer perimeter/area of the inorganic particles on the polished surface of the sintered target was 0.2 (1/μm), arcing rate was 45 (Count/hour), and number of particles on the substrate was 75.

Comparative Example 10 did not satisfy the condition of the present invention; namely, "to have a dimension and a shape in which a value obtained by dividing the outer perimeter (unit: μm) of individual inorganic particle by the area (unit: μm$^2$) of the inorganic particle is 0.4 or more (unit: 1/μm) on average".

As described above, with Examples 18 to 21, 23 and 24, it was confirmed that both the arcing rate and number of particles had decreased in comparison to Comparative Examples 7, 8 and 10 which deviate from the conditions of the present invention.

be 3:1, and so that the composition of the alloyed portion would be Co-16 mol % Cr-16 mol % Pt-5 mol % B. The combination of alloy and inorganic substances is as shown in Table 5.

The powders were placed in a 10-liter ball mill pot together with zirconia balls as the grinding media, and the ball mill rotated for 20 hours to mix the powders.

The mixed powder was filled in a carbon mold, and hot pressed in a vacuum atmosphere under the following conditions; namely, temperature of 1100° C., holding time of 2 hours, and welding pressure of 30 MPa, to obtain a sintered compact. This was further cut with a lathe to obtain a target of a shape with a diameter of 165.1 mm and thickness of 6.35 mm, and this target was sputtered with a DC magnetron sputtering device.

The sputtering conditions were sputtering power of 1 kW and Ar gas pressure of 0.5 Pa. After performing 2 kWhr pre-sputtering, sputtering was performed to achieve the intended film thickness of 1000 nm on the aluminum substrate with a 3.5-inch diameter. Subsequently, the number of particles that adhered to the substrate was measured with a particle counter. In addition, the arcing rate upon continuously sputtering for 12.0 hours with sputtering power of 1 kW was defined based on the number of arcing occurrences which was measured with an arcing counter mounted on the sputtering power source.

Moreover, the outer perimeter and area of inorganic particles in a structural image based on the observation of the polished surface of the sintered compact were obtained with image processing software, and a value was calculated by dividing the outer perimeter by the area.

The foregoing results are shown in Table 5.

In Example 22, used was a Co—Cr—Pt—B—Ti$_2$O$_3$ target. The electric resistivity of the inorganic substances contained in the target was $8\times10^{-3}$ Ω·m, outer perimeter/area of the inorganic particles on the polished surface of the sintered target was 0.8 (1/μm), arcing rate was 7 (Count/hour), and

TABLE 4

| | Type of target | Electric resistivity of inorganic substance (Ω · m) | Outer perimeter/area on polished surface (1/μm) | Arcing rate (Count/hour) | Number of particles on substrate (Particle) |
|---|---|---|---|---|---|
| Example 18 | Co—Cr—Pt—Nb$_2$O$_5$ | $8 \times 10^0$ | 1.3 | 11 | 27 |
| Example 19 | Co—Cr—Pt—Ti$_2$O$_3$ | $8 \times 10^{-3}$ | 0.6 | 7 | 15 |
| Example 20 | Co—Cr—Pt—TiN | $1 \times 10^{-6}$ | 0.6 | 6 | 11 |
| Example 21 | Co—Cr—Pt—WC | $5 \times 10^{-5}$ | 1.3 | 4 | 9 |
| Example 23 | Co—Cr—Pt—Nb$_2$O$_5$ | $8 \times 10^0$ | 0.5 | 16 | 29 |
| Example 24 | Co—Cr—Pt—CrO$_2$ | $5 \times 10^{-5}$ | 0.9 | 7 | 26 |
| Comparative Example 7 | Co—Cr—Pt—Al$_2$O$_3$ | $1 \times 10^{14}$ | 1.2 | 58 | 67 |
| Comparative Example 8 | Co—Cr—Pt—SiO$_2$ | $1 \times 10^{12}$ | 1.0 | 31 | 29 |
| Comparative Example 10 | Co—Cr—Pt—Nb$_2$O$_5$ | $8 \times 10^0$ | 0.2 | 45 | 75 |

Example 22, Comparative Example 9

In Example 22 and Comparative Example 9, prepared were, as the metal material, Co powder with an average grain size of 3 μm, Cr powder with an average grain size of 5 μm, Pt powder with an average grain size of 2 μm, and B powder with an average grain size of 5 μm, and, as the inorganic material, Ti$_2$O$_3$ powder with an average grain size of 5 μm and SiO$_2$ powder with an average grain size of 1 μm.

These powders were weighed so that the volume ratio of the alloy and inorganic substances after being sintered would number of particles on the substrate was 13. In Comparative Example 9, used was a Co—Cr—Pt—B—SiO$_2$ target. The electric resistivity of the inorganic substances contained in the target was $1\times10^{12}$ Ω·m, outer perimeter/area of the inorganic particles on the polished surface of the sintered target was 1.3 (1/μm), arcing rate was 45 (Count/hour), and number of particles on the substrate was 46. Comparative Example 9 did not satisfy the condition of the present invention; namely, "electric resistivity of inorganic particles is $1\times10^1$ Ω·m or less". As described above, with Example 22, it was confirmed that both the arcing rate and number of particles had decreased in comparison to Comparative Example 9 which deviates from the conditions of the present invention.

TABLE 5

| Type of target | Electric resistivity of inorganic substance ($\Omega \cdot m$) | Outer perimeter/area on polished surface ($1/\mu m$) | Arcing rate (Count/hour) | Number of particles on substrate (Particle) |
|---|---|---|---|---|
| Example 22 | Co—Cr—Pt—B—$Ti_2O_3$ | $8 \times 10^{-3}$ | 0.8 | 7 | 13 |
| Comparative Example 9 | Co—Cr—Pt—B—$SiO_2$ | $1 \times 10^{12}$ | 1.3 | 45 | 46 |

The present invention provides an inorganic-particle-dispersed sputtering target, in which the inorganic particles are less charged and arcing occurs less frequently when performing sputtering with a magnetron sputtering device comprising a DC power source, by adjusting the electric resistivity, dimension and shape of the inorganic particles. Accordingly, by using the sputtering target of the present invention, the occurrence of particles attributable to the arcing reduces, and a significant effect of improving the yield in forming a thin film is obtained.

The present invention is useful as an inorganic-particle-dispersed sputtering target for use in the deposition of a magnetic thin film of a magnetic recording medium, and particularly of a granular magnetic recording film of a hard disk adopting the perpendicular magnetic recording system.

The invention claimed is:

1. An inorganic-particle-dispersed sputtering target for use in a magnetron sputtering device comprising a DC power source, the sputtering target in which inorganic particles are dispersed in a metal base material essentially consisting of Co, wherein the inorganic particles have an electric resistivity of $1 \times 10^1$ $\Omega \cdot m$ or less and the volume ratio of the inorganic particles in the target is 50% or less, and said inorganic particles having a dimension and a shape in which a value obtained by dividing the surface area (unit: $\mu m^2$) of inorganic particles dispersed in the sputtering target by the volume (unit: $\mu m^3$) of the inorganic particles is 0.6 or more (unit $1/\mu m$).

2. An inorganic-particle-dispersed sputtering target for use in a magnetron sputtering device comprising a DC power source, the sputtering target in which inorganic particles are dispersed in an alloy base material with a composition containing 5 at % or more and 50 at % or less of Pt and the remainder being Co, wherein the inorganic particles have an electric resistivity of $1 \times 10^1$ $\Omega \cdot m$ or less and the volume ratio of the inorganic particles in the target is 50% or less, and said inorganic particles having a dimension and a shape in which a value obtained by dividing the surface area (unit: $\mu m^2$) of inorganic particles dispersed in the sputtering target by the volume (unit: $\mu m^3$) of the inorganic particles is 0.6 or more (unit $1/\mu m$).

3. An inorganic-particle-dispersed sputtering target for use in a magnetron sputtering device comprising a DC power source, the sputtering target in which inorganic particles are dispersed in an alloy base material with a composition containing 5 at % or more and 40 at % or less of Cr and the remainder being Co, wherein the inorganic particles have an electric resistivity of $1 \times 10^1$ $\Omega \cdot m$ or less and the volume ratio of the inorganic particles in the target is 50% or less, and said inorganic particles having a dimension and a shape in which a value obtained by dividing the surface area (unit: $\mu m^2$) of inorganic particles dispersed in the sputtering target by the volume (unit: $\mu m^3$) of the inorganic particles is 0.6 or more (unit $1/\mu m$).

4. An inorganic-particle-dispersed sputtering target for use in a magnetron sputtering device comprising a DC power source, the sputtering target in which inorganic particles are dispersed in an alloy base material with a composition containing 5 at % or more and 40 at % or less of Cr, 5 at % or more and 30 at % or less of Pt, and the remainder being Co, wherein the inorganic particles have an electric resistivity of $1 \times 10^1$ $\Omega \cdot m$ or less and the volume ratio of the inorganic particles in the target is 50% or less, and said inorganic particles having a dimension and a shape in which a value obtained by dividing the surface area (unit: $\mu m^2$) of inorganic particles dispersed in the sputtering target by the volume (unit: $\mu m^3$) of the inorganic particles is 0.6 or more (unit $1/\mu m$).

5. The inorganic-particle-dispersed sputtering target according to claim 1, wherein the metal base material in which the inorganic particles are dispersed contains, as an additive element, 0.5 at % or more and 10 at % or less of one or more elements selected from B, Ti, V, Mn, Zr, Nb, Ru, Mo, Ta and W.

6. The inorganic-particle-dispersed sputtering target according to claim 1, wherein the inorganic particles are a material of one or more components selected from carbon, oxide, nitride and carbide.

7. An inorganic-particle-dispersed sputtering target for use in a magnetron sputtering device comprising a DC power source, the sputtering target comprising a metal-based matrix essentially consisting of Co and containing inorganic particles dispersed therein, wherein the inorganic particles have an electric resistivity of $1 \times 10$ $\Omega \cdot m$ or less, wherein the inorganic particles as a whole have a volume ratio of 50% or less of the volume of the target, and wherein the inorganic particles appearing in a cross-section of the target have a dimension and a shape such that an average value for the outer perimeter (unit: $\mu m$) divided by the area (unit: $\mu m^2$) of each of the inorganic particles is 0.4 or more (unit $1/\mu m$).

8. The inorganic-particle-dispersed sputtering target according to claim 7, wherein the metal-based matrix contains 0.5 at % or more and 10 at % or less in total of one or more elements selected from the group consisting of B, Ti, V, Mn, Zr, Nb, Ru, Mo, Ta and W.

9. The inorganic-particle-dispersed sputtering target according to claim 7, wherein the inorganic particles are of one or more materials selected from the group consisting of carbon, oxide, nitride and carbide.

10. An inorganic-particle-dispersed sputtering target for use in a magnetron sputtering device comprising a DC power source, the sputtering target in which inorganic particles are dispersed in an alloy base material with a composition containing 5 at % or more and 50 at % or less of Pt and the remainder being Co, wherein the inorganic particles have an electric resistivity of $1 \times 10^1$ Ω·m or less, the volume ratio of the inorganic particles in the target is 50% or less, and said inorganic particles have a dimension and a shape in which, in a structure based on a cross-section observation of the sputtering target, a value obtained by dividing an outer perimeter (unit: μm) of an individual inorganic particle by an area (unit: μm$^2$) of the individual inorganic particle is 0.4 or more (unit 1/μm) on average.

11. An inorganic-particle-dispersed sputtering target for use in a magnetron sputtering device comprising a DC power source, the sputtering target in which inorganic particles are dispersed in an alloy base material with a composition containing 5 at % or more and 40 at % or less of Cr and the remainder being Co, wherein the inorganic particles have an electric resistivity of $1 \times 10^1$ Ω·m or less, the volume ratio of the inorganic particles in the target is 50% or less, and said inorganic particles have a dimension and a shape in which, in a structure based on a cross-section observation of the sputtering target, a value obtained by dividing an outer perimeter (unit: μm) of an individual inorganic particle by an area (unit: μm$^2$) of the individual inorganic particle is 0.4 or more (unit 1/μm) on average.

12. An inorganic-particle-dispersed sputtering target for use in a magnetron sputtering device comprising a DC power source, the sputtering target in which inorganic particles are dispersed in an alloy base material with a composition containing 5 at % or more and 40 at % or less of Cr, 5 at % or more and 30 at % or less of Pt, and the remainder being Co, wherein the inorganic particles have an electric resistivity of $1 \times 10^1$ Ω·m or less, the volume ratio of the inorganic particles in the target is 50% or less, and said inorganic particles have a dimension and a shape in which, in a structure based on a cross-section observation of the sputtering target, a value obtained by dividing an outer perimeter (unit: μm) of an individual inorganic particle by an area (unit: μm$^2$) of the individual inorganic particle is 0.4 or more (unit 1/μm) on average.

13. The inorganic-particle-dispersed sputtering target according to claim 12, wherein the alloy base material contains 0.5 at % or more and 10 at % or less in total of one or more elements selected from the group consisting of B, Ti, V, Mn, Zr, Nb, Ru, Mo, Ta and W.

14. The inorganic-particle-dispersed sputtering target according to claim 13, wherein the inorganic particles are of one or more materials selected from the group consisting of carbon, oxide, nitride and carbide.

15. The inorganic-particle-dispersed sputtering target according to claim 4, wherein the alloy base material contains, 0.5 at % or more and 10 at % or less in total of one or more elements selected from the group consisting of B, Ti, V, Mn, Zr, Nb, Ru, Mo, Ta and W.

16. The inorganic-particle-dispersed sputtering target according to claim 15, wherein the inorganic particles are of one or more materials selected from the group consisting of carbon, oxide, nitride and carbide.

17. The inorganic-particle-dispersed sputtering target according to claim 12, wherein said inorganic particles have a dimension and a shape in which a value obtained by dividing the surface area (unit: μm$^2$) of inorganic particles dispersed in the sputtering target by the volume (unit: μm$^3$) of the inorganic particles is 0.6 or more (unit 1 μm).

18. The inorganic-particle-dispersed sputtering target according to claim 11, wherein said inorganic particles have a dimension and a shape in which a value obtained by dividing the surface area (unit: μm$^2$) of inorganic particles dispersed in the sputtering target by the volume (unit: μm$^3$) of the inorganic particles is 0.6 or more (unit 1/μm).

19. The inorganic-particle-dispersed sputtering target according to claim 10, wherein said inorganic particles have a dimension and a shape in which a value obtained by dividing the surface area (unit: μm$^2$) of inorganic particles dispersed in the sputtering target by the volume (unit: μm$^3$) of the inorganic particles is 0.6 or more (unit 1/μm).

20. The inorganic-particle-dispersed sputtering target according to claim 7, wherein said inorganic particles have a dimension and a shape in which a value obtained by dividing the surface area (unit: μm$^2$) of inorganic particles dispersed in the sputtering target by the volume (unit: μm$^3$) of the inorganic particles is 0.6 or more (unit 1/μm).

\* \* \* \* \*